(12) United States Patent
Dunne

(10) Patent No.: US 6,542,004 B1
(45) Date of Patent: Apr. 1, 2003

(54) OUTPUT BUFFER METHOD AND APPARATUS WITH ON RESISTANCE AND SKEW CONTROL

(75) Inventor: Anthony Dunne, Co. Cork (IE)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/808,488

(22) Filed: Mar. 13, 2001

Related U.S. Application Data

(63) Continuation-in-part of application No. 09/597,099, filed on Jun. 20, 2000.

(51) Int. Cl.[7] .................. H03K 19/0175; H03K 19/094
(52) U.S. Cl. ......................... 326/87; 326/56; 326/112; 326/83; 327/539
(58) Field of Search ................ 326/87, 56, 112, 326/57, 30, 83; 327/539

(56) References Cited

U.S. PATENT DOCUMENTS

| | | | | |
|---|---|---|---|---|
| 4,701,641 A | * | 10/1987 | Harris et al. | 326/37 |
| 4,723,108 A | | 2/1988 | Murphy et al. | 323/315 |
| 4,877,978 A | | 10/1989 | Platt | 307/473 |
| 4,978,905 A | | 12/1990 | Hoff et al. | 323/314 |
| 5,013,940 A | | 5/1991 | Ansel | 307/473 |
| 5,619,163 A | * | 4/1997 | Koo | 327/539 |
| 5,900,772 A | * | 5/1999 | Somerville et al. | 327/539 |
| 6,037,803 A | * | 3/2000 | Klein | 326/86 |
| 6,236,237 B1 | * | 5/2001 | Wong et al. | 326/83 |
| 6,323,801 B1 | * | 11/2001 | McCartney et al. | 341/172 |

* cited by examiner

Primary Examiner—Michael G. Lee
Assistant Examiner—Steven S. Paik
(74) Attorney, Agent, or Firm—Suiter & Associates PC

(57) ABSTRACT

A pre-buffer circuit configured to generate one or more output control signals in response to a bandgap reference based control circuit. The one or more output control signals control output ON resistance and slew rate so as to limit variations in ringing and skew.

29 Claims, 3 Drawing Sheets

OUTPUT BUFFER METHOD AND APPARATUS WITH ON RESISTANCE AND SKEW CONTROL

CROSS-REFERENCE To RELATED APPLICATIONS

The present application is a continuation-in-part of U.S. patent application Ser. No. 09/597,099, filed on Jun. 20, 2000. Said application is incorporated herein in its entirety by reference. Co-owned U.S. Pat. Nos. 4,723,108; 4,877, 978; 4,978,905; and 5,013,940 are also incorporated herein by reference in their entirety.

TECHNICAL FIELD

The present invention generally relates to a method and/or architecture for implementing an output buffer, and more particularly, to a method and/or architecture for implementing a high speed output buffer with ON resistance and skew control.

BACKGROUND OF THE INVENTION

Conventional approaches for implementing output buffers use a pre-buffer section to control rise and fall rates of gate voltages. Referring to FIG. 1, a schematic of a circuit illustrating such an approach is shown. The circuit 10 comprises a pre-buffer 12 and an I/O circuit 14. The pre-buffer 10 comprises a current source I1, a current source I2, a number of MOSFETs P1–P8 and a number ofMOSFETs N1–N8. The circuit 10 receives the signal IN. The circuit 10 generates the signal OUT1 and the signal OUT2. A current on the signals OUT1 and OUT2 (presented, for example, to output capacitors C1 and C2) has the relationship i=cdv/dt. By limiting the transient current of the signals OUT1 and OUT2, by controlling a turn on rate of the MOSFETs P7, N7, P8 and N8, the likelihood of rapid rates of change of current in the power and ground inductances is reduced. In turn, a ground or power bounce voltage via the relationship v=ldi/dt is reduced. The pre-buffer section 12 also causes the output device P7 connected to the output OUT1 to shut off before the MOSFET N7 turns on, limiting crowbar current in the MOSFET P7 and the MOSFET N7. The pre-buffer 12 operates as follows: (i) if the MOSFET P7 is on and the MOSFET N7 is off, then the MOSFET N3, the MOSFET N4 and the MOSFET N5 are on, while the MOSFET P2 remains off; (ii) if the signal IN goes high, the MOSFET N3 and the MOSFET N5 turn off immediately, while the MOSFET P2 turns on fast and the MOSFET P7 shuts off fast. At the same time, the MOSFET N6 turns off fast and the MOSFET P6 begins to pull the gates of the MOSFET N8 and N7 high. The gates of the MOSFET N7 and N8 are pulled high slowly, since the MOSFET P6 is a weak MOSFET.

The weak MOSFET P6 is also assisted by the current source I2 and a current mirror (i.e., the MOSFET P3, the MOSFET P4, and the MOSFET P5). When the weak MOSFET P6 is assisted by the current mirror, the MOSFET P7 and the MOSFET P8 turn off fast, while the MOSFET N7 and the MOSFET N8 turn on slowly. The MOSFET N7, the MOSFET N8 turn off fast in the opposite direction with the MOSFET P7 and the MOSFET P8 turting on slowly.

The MOSFET N5 and P6 are sized to barely operate correctly in the fast process, temperature and VCC corner. In the slow comer, the current sources I1 and I2 supply additional current drive to ensure proper operation. The voltage rate of change at the gates of the output MOSFETs P7, N7, P8 and N8 is as slow as possible during turn on, while still maintaining correct operation. The pre-buffer 12 requires the current sources I1 and I2 to vary with temperature and supply variations. The current sources I1 and I2 are made temperature and supply dependent to enable the pre-buffer section 12 to operate correctly. The temperature and supply dependencies are implemented to ensure a slow enough turn on of the output MOSFETs P7 and N8, while still ensuring operation in the slow comer.

Conventional pre-buffers are very difficult to design and optimize. Likewise, conventional pre-buffers require significant updating with each new process version. Additionally, if an inverting scheme is to be implemented, then accurate matching of P and N channel MOSFETs is required for accurate skew and duty cycle performance. Furthermore, the accurate matching of P and N channel MOSFETs is not practical.

SUMMARY OF THE INVENTION

Controlling ground/power bounce at high frequencies is a substantial problem common to all higher frequency integrated circuits (IC's). The present invention provides a control voltage generator coupled to a pre-buffer which is coupled to an output driver. Together these three functional groups allow a single control voltage generator to be utilized even where multiple outputs are required.

The objects, features and advantages of the present invention include providing a method and/or architecture for implementing a high speed, low skew, low voltage (e.g., transistor-transistor logic (TTL)) output buffer with optional inverting capability that may (i) provide a charge to discharge of an output device that may be less process dependent, (ii) provide current sources that may be derived from a single bandgap source (e.g., allowing slow charge and discharge times to be better matched), (ii) allow the current sources to be derived by forcing an internally generated bandgap voltage across an external resistor to generate current sources that may not be dependent on a process absolute resistor value, (iv) allow the current sources to be VCC, process and temperature dependent to further reduce signal variation, (v) provide a well controlled duty cycle for an inverted implementation, (vi) provide controlled ramp rates and voltage levels allowing for slew control and output ON resistance control, (vii) provide low skew, and/or (viii) reduce ringing and power/ground bounce.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
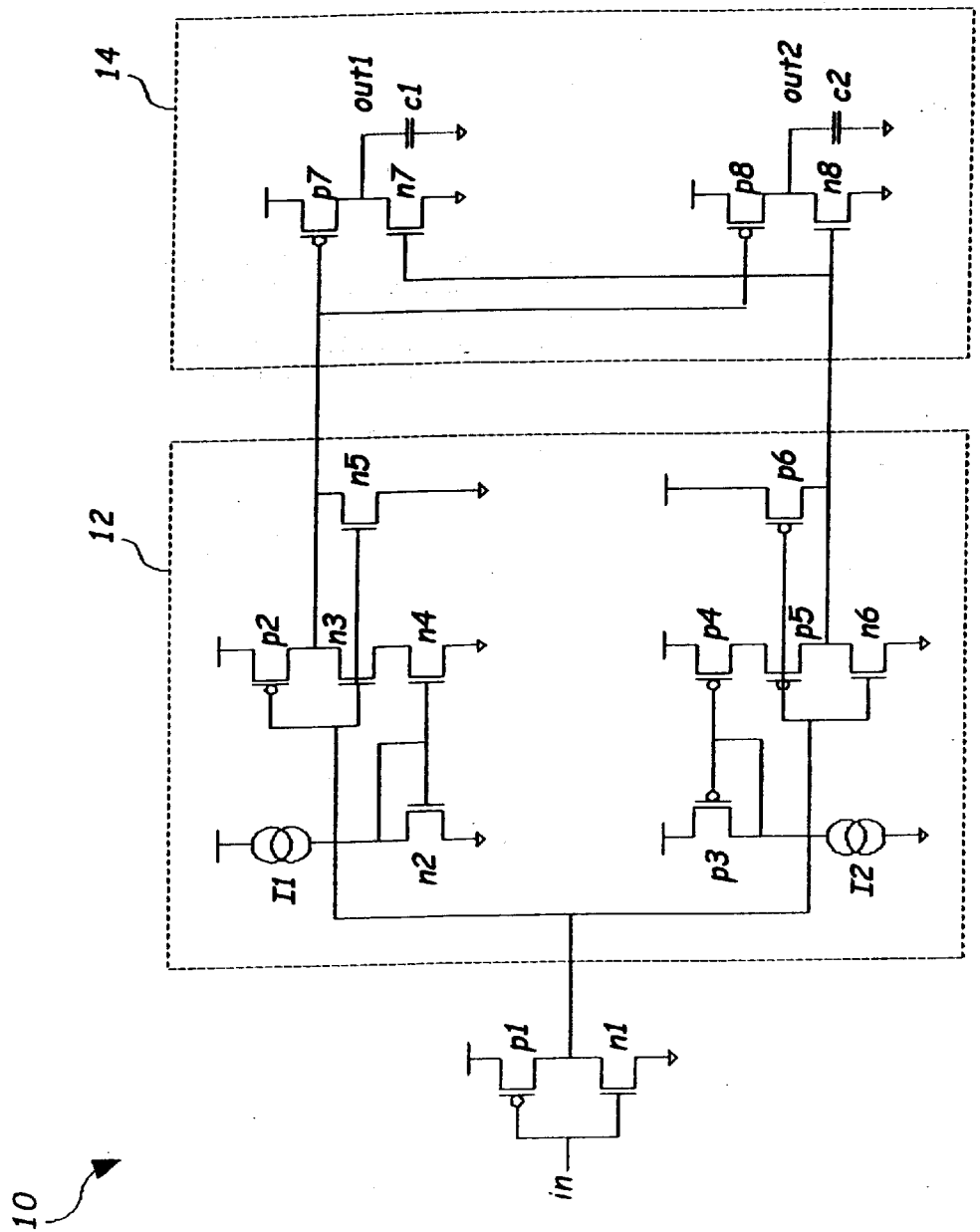
FIG. 1 is a schematic of a conventional architecture for a buffer.
Figure 2:
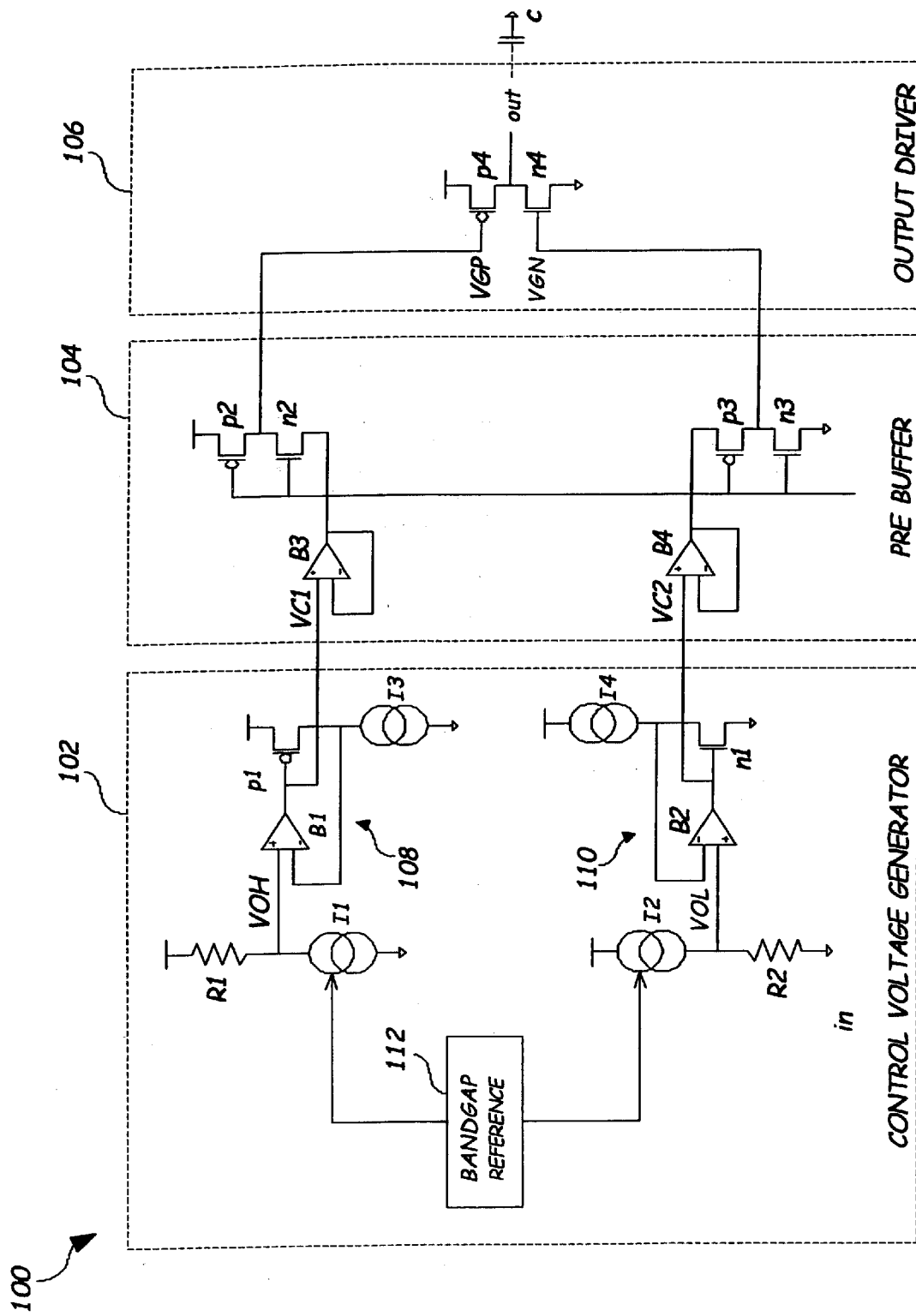
FIG. 2 is a schematic of a preferred embodiment of the present invention.

The present invention generates gate control voltages to control at device driver slew and ON resistance where process, temperature, and supply fluctuate. By maintaining relatively constant output device ON resistance ringing and power/ground bounce are minimized. In structure, as may be observed in FIG. 2, a preferred embodiment of the present invention 100 includes three portions (or circuits). Namely, a control voltage generator 102, a pre-buffer 104, and an output driver 106. Briefly, in operands, the control voltages VC1 and VC2 are buffered by B3 and B4 in pre-buffer 104. In a preferred embodiment the buffers B3 and B4 are output slew limited, such that when the control voltages VC1 and VC2 are applied through switches n2 and p3, respectively, in different clock phases, the output device gate being turned on discharges/charges slowly while the output device being turned off is turned off fast. In this fashion, the output slew rate is controlled at the "out" node so as to limit transient currents in, for example, an output capacitor (C) (FIG. 2). Transient currents are controlled according to the relationship i=cdv/dt. Thus, "crowbar" current of the output devices p4, n4 is limited (output driver 106) since the device state moves from on to off quickly and off to on slowly (note the gate charge/sidcharge is limited by the slew rate of either B4 or B3 respectively).

In a preferred embodiment, the control voltage generator 102 (FIG. 2) operates in two cooperating sections (108, 110). The bandgap reference 112 is utilized to generate a current (I2=Vba/R where R is contained in the bandgap). Therefore, for example, in regard to section 110 of the control voltage generator 102, VOL is given by VOL=(Vba/R)R2. If R2 and R are of the same material then VOL is tightly controlled since Vba is a well controlled bandgap voltage. R2 and I2 are preferably selected to provide a voltage VOL equal to the output low value specification desired for the output buffer. In operation VOL is then forced across n1 while I4 is forced through n1. The ON resistance of n1 is then equivalent to VOL/I4. In a presently preferred embodiment I4 would be given by Vba/R4 where R4 is a resistor (not shown). Therefore, the ON resistance of n1 is VOL(R4/Vba) or Vba(R2/R)(R4/Vba) or (R2/R)R4. Since we may assume R2 and R are fabricated from identical materials the ON resistance of n1 is equal to K·R4 where K is equal to R2/R. Thus, the ON resistance of n1 is well controlled (well tempered) if R4 is well controlled. It will be appreciated by those skilled in the art that R4 may be implemented as an on chip resistor or a trimmed on chip resistor with a low temperature coefficient (for even better control the resistor may be implemented off chip, i.e., external to the chip). R4's value may be determined by LASER trimming, fuses, and/or EEPROM or Flash bits, or the like. If n1 has a well controlled ON resistance then any NMOS device for which it is appropriately matched will also have a well controlled ON resistance. This ON resistance relationship is analogous to having an identical Vgs. For example, the voltage VC2 is the Vgs of n1 and if p3 is on then VC2 is applied to the gate of the output NMOS n4. Therefore, the gate voltage of n4 is equal to VC2 when n4 is on and grounded through n3 when n3 is off. It will also be appreciated the gate of p4 is VC1 when on and VCC when off.

Thus, power and ground bounce may be controlled, with embodiments of the present invention, by controlling the output ON resistance of, for example, p4 and n4. Likewise, power and ground bounce may be controlled, with embodiments of the present invention, by controlling slew rates, for example, on the gates of p4 and n4 by making buffers B3 and B4 skew rate limited. Furthermore, "crowbar" current is also controlled, for example, by the slow turn on of output devices p4, n4 in relation to their fast turn off via p2, n3 respectively.

It will also be understood by those skilled in the art, that buffers B3 and B4 may be output slew rate limited such that the node slew of VGP and VGN is limited at a rate (dv/dt)=(i/c) during output device turn on (where i is related to the bias currents for the operational amplifiers and c is the capacitance at the nodes VGP and VGN). Since i may be derived from a bandgap reference it may be well controlled (for example, with an external resistor or the like) such that the charge/discharge slew rates during output device turn on are well controlled and matched. This also enables implementation of an invert mode where charge and discharge are well matched by using charge and discharge currents derived from the same source using current mirrors. Thus, prior art substantial matching of PMOS and NMOS devices is not necessary. Consequentially, the economically prohibited prior art problem of matching in a production environment is eliminated. Additionally, the output ON resistance of the present invention tempers slew rate by reducing parasitic overshoot and ringing.

In a further embodiment of the present invention, the bias currents for the buffers B3 and 134 may be made process, temperature, and supply dependent so as to further compensate for slew effects and variations. Likewise, currents I3 and I4 may be generated off chip by forcing an internally generated bandgap voltage across an external resistor so as to provide further control over currents, ramp rates, and skew. By generating all currents offchip complete control over slew rates may be obtained. In this fashion a designer may fashion a system, for example with reduced edge rates at lower frequencies so as to reduce electromagnetic interference.

In yet another preferred embodiment, all of the currents may be made adjustable, for example, by on chip current DACS (or the like). The DAC bits may then be adjusted by a user via control logic, fuses, EEPROM or Flash bits, or the like. Likewise, all currents may be LASER trimmed. In yet still a further embodiment, wherein an invert scheme is desired, the various methods described in my previously filed U.S. patent application Ser. No. 09/597,099 may be utilized.

Figure 3:
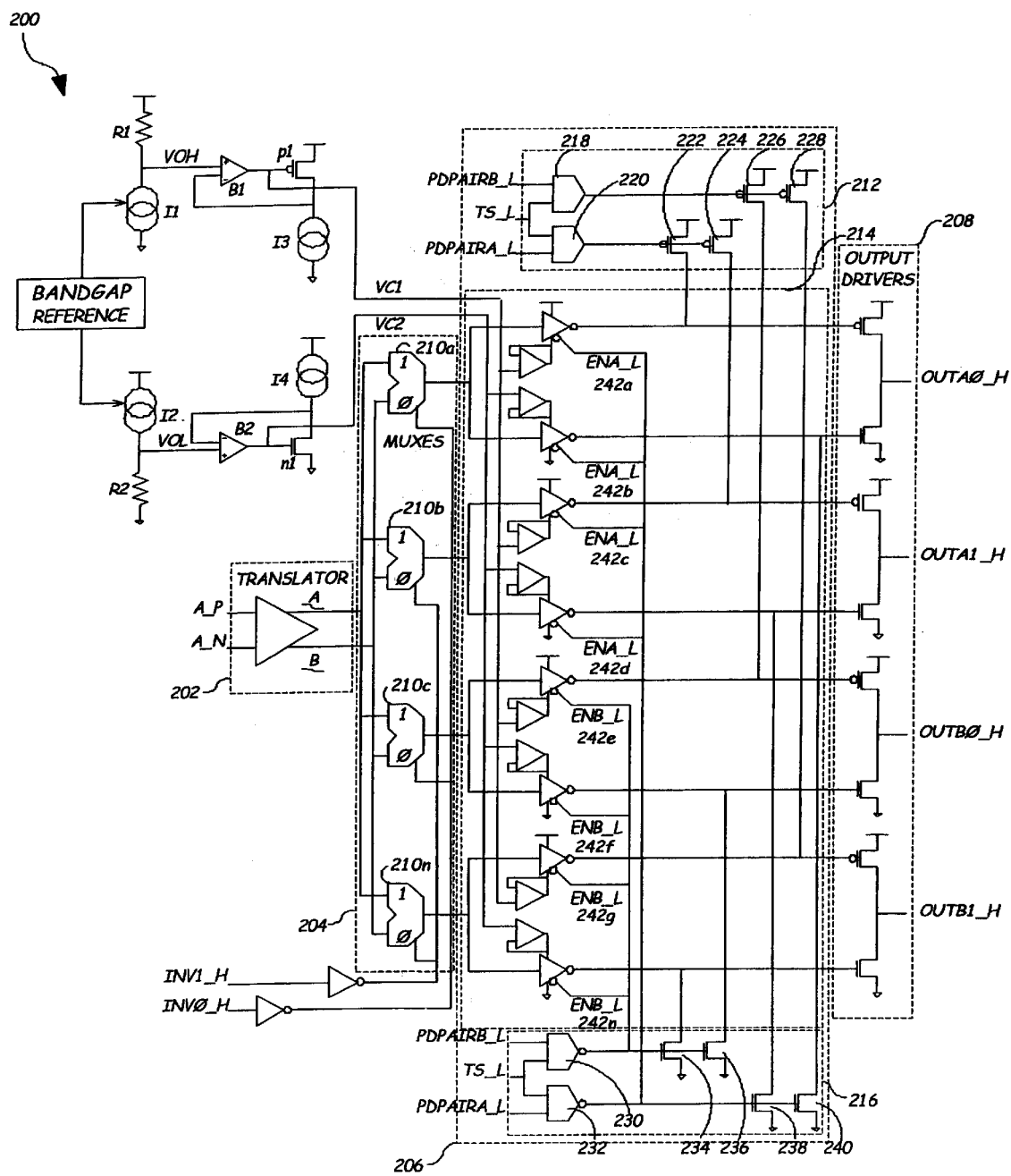
FIG. 3 is a detailed block diagram of an implementation of the present invention.

Referring now to FIG. 3, an example implementation of a circuit 200 in accordance with the present invention is shown. As may be seen from the structure of circuit 200, a single control voltage generator 102 (FIG. 2) may be utilized to provide controlled voltages to a number of output driver circuits (106, FIG. 2) via a like number of pre-buffer circuits (104, FIG. 2). The circuit 200 generally comprises an input section 202 (for translating different input level signals to CMOS levels), a multiplexer section 204, a pre-buffer section 206 and an output section 208.

The multiplexer section 204 generally comprises a number of multiplexers 210a–210n. The pre-buffer section 206 generally further comprises a logic section, a pre-buffer section 214 and a logic section. The logic section 212 generally comprises a gate 218, a gate 220, a MOSFET 222, a MOSFET 224, a MOSFET 226 and a MOSFET 228. The gates 218 and 220 are shown implemented as AND gates. However, other gates may be implemented accordingly to meet the design criteria of a particular implementation. The gate 218 may have a first input that may receive a signal (e.g., PDPAIRB_L) and a second input that may receive a signal (e.g., TS_L). The gate 220 may have a fimt input that may receive the signal TS_L and a second input that may receive a signal (e.g., PDPAIRA_L). The logic section 216 generally comprises a gate 230, a gate 232, a MOSFET 234, a MOSFET 236, a MOSFET 238 and a MOSFET 240. The gates 230 and 232 are shown implemented as NAND gates. However, other gates may be implemented accordingly to meet the design criteria of a particular implementation. The gate 230 may have a first input that may receive the signal PDPAIRB_L and a second input that may receive the signal TS_L. The gate 232 may have a first input that may receive the signal TS_L and a second input that may receive the signal PDPAIRA_L.

The multiplexers 210a–210n may each have a first input that may receive the signal A and a second input that may receive the signal B. Some of the multiplexers (e.g., 210a and 210c) may receive an inversion of a control signal (e.g., INV0_H). Some of the multiplexers (e.g., 210b and 210n) may receive an inversion of a control signal (e.g., INV1_H).

The pre-buffer section 214 may condition the signals received from the multiplexer section 204 before presenting the signals to the output section 208. In one example, the multiplexing for the invert function in the multiplexer section 204 may be accomplished with CMOS multiplexers. The pre-buffer section 214 generally comprises a number of tristate buffers 242a–242n that may control edge rates of signals supplied to the output section 208 as previously described. Tristate control is not illustrated in FIG. 2 (it will be appreciated by those skilled in the art, that this may be accomplished, for example, by adding an nmos in parallel with n3, a pmos in series with p3, a pmos in parallel with p2, and an nmos in series with n2.

The circuit 200 illustrates an overall architecture of a four (4) output bank (OUTA0_H, OUTA1_H, OUTB0_H, and OUTB1_H). In one example, the input signals A_P and A_N may be implemented as 400 mv CML level signals. The 400 mv signals may be converted to CMOS level signals by the translator 202. The multiplexers 210a–210n may enable an invert capability of the circuit 200.

The circuit 100 may be implemented as a low voltage transistor-transistor logic (LVTTL) output buffer. The LVTTL output buffer may be implemented to provide output signals that meet the LVTTL output specification (e.g., 0.4V to 2.4V while driving a load of 50 ohms to VCC/2 in parallel with a capacitor load of 25 pF to ground up to a 200 MHz rate). The circuit 100 may enable a pair of pre-buffer output signals (e.g., the signals VGP and VGN) to be in phase with each other (FIG. 2). However, output rates may be controlled to minimize power and ground bounce voltages. Additionally, the circuit 100 may control skew at the output with respect to another similar output. The circuit 100 (or 200) may provide a charge/discharge of gate capacitance of a number of output devices that may be current source controlled. Previous output buffers utilize a resistance of an MOS device with minimal current source assistance for compensation. Additionally, the circuit 100 may provide (i) tristating and (ii) power down capability. The circuit 100 may provide a simple output buffer operation. The circuit 100 may allow a charge/discharge of the gates of the output devices p4 and n4 to be less process dependent. As previously noted, it is preferred that the circuit 100 allows the charge/discharge currents in B3, B4 to be derived from the same bandgap source (FIG. 2). The charge/discharge currents in B3, B4 may result in slow charge and discharge times that may be accurately matched. Ths gives a well controlled duty cycle and skew for the invert case compared to the older implementation.

Further, to generate currents that are not dependent on a process absolute resistor value, as previously noted, in a preferred embodiment, the charge/discharge currents in B3, 134 may be derived by forcing an internally generated bandgap voltage across an external resistor. The charge/discharge currents in B3, B4 may be made VCC, process and temperature dependent to reduce further signal variation. In one alternate example, the multiplexing for the invert function of the multiplexer 204 may be accomplished in CML rather than with CMOS muxes. In another alternate example, the multiplexing of the multiplexer 204 may be accomplished in the pre-buffers section 206. The implementation of the multiplexing within the pre-buffers section 206 may have an increased area and/or increased power consumption.

In another alternate example, the charge/discharge currents in B3, B4 may also be compensated for (e.g., VCC, process and temperature dependent).

In another alternate example, the charge/discharge currents in B3, B4 may be controlled by a current source digital analog converter (DAC). The DAC may allow an output edge rate to be reduced. The DAC may allow programmable edge rates that may be configured to reduce EMI at lower frequencies. In another alternate example, the charge/discharge currents in B3, B4 may include nonvolatile, LASER or fuse trimming for precise current and edge rate control.

The circuit 100 may provide pure (e.g., constant) charge/discharge currents in B3, B4 to drive the gates of output devices. The currents may enable excellent control of a duty cycle and skew in an inverted mode of operation. The circuit 100 may allow the charge/discharge currents in B3, B4 to have compensating variations for process, temperature and VCC variations as well as simple control of edge rates if desired.

The circuit 100 may control ground and power bounce voltages at high frequencies. The ground and power bounce voltage may be a difficult problem, common to all high frequency ICs that are outputting large signals such as CMOS or LVTTL devices.

The various signals are generally on (e.g., a digital HIGH, or 1) or off (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention

I claim:

1. A circuit for implementing an output buffer with ON resistance and skew control, comprising:

a control section;

an output section including a first output switch and a second output switch; and a pre-buffer section having a circuit configured to generate first and second output control signals in response to current sources and an input signal, in which a first voltage at a first control terminal of a first control switch of the control section is switchably transferred to a first output control signal and a second voltage at a second control terminal of a second control switch of the control section is switchably transferred to a second output control signal, wherein the first output control signal is coupled to the first output switch and the second output control signal is coupled to the second output switch, wherein the ON resistance of the first control switch of the control section sets the ON resistance of the first output switch and the ON resistance of the second control switch of the control section sets the ON resistance of the second output switch, wherein variations in ringing and skew are limited, wherein at least one of said current sources is derived by forcing an internally generated bandgap reference voltage across an external resistor.

2. An output buffer apparatus having ON resistance control, comprising:
   (a) a control voltage generator having a bandgap reference, a first voltage output, and a second voltage output;
   (b) at least one pre-buffer having a first slew rate limited buffer driven by said first voltage output of said control voltage generator and a second slew rate limited buffer driven by said second voltage output of said control voltage generator, said at least one pre-buffer generating a first control voltage and a second control voltage;
   (c) an output driver operably associated with each at least one pre-buffer, said output driver being controlled by said first control voltage and said second control voltage so as to produce an output signal; and
   (d) a first and second switch associated with said first and second slew rate limited buffers of said pre-buffer such that discharge/charge is slow as an output device is turned on so as to limit ground/power bounce.

3. The output buffer apparatus of claim 2, wherein said output driver limits transient currents according to the relationship i=cdv/dt.

4. The output buffer apparatus of claim 2, wherein crowbar current at said output driver is limited by the slew rate of said buffers and fast turn off of a device being turned off.

5. The output buffer apparatus of claim 2, further comprising discharge/charge current control for programmably controlling edge rates.

6. The output buffer apparatus of claim 2, further comprising an ON resistance control voltage controller for programmably controlling edge rates.

7. The output buffer apparatus of claim 2, further comprising discharge/charge current control for minimizing at least one of ringing and skew.

8. A circuit for implementing an output buffer with ON resistance and skew control, comprising:
   a control voltage section which sets a control voltage that switches a control switch on;
   a pre-buffer section which switchably transfers the control voltage; and
   an output section having an output switch, the output switch being switched on by the control voltage switchably transferred by the pre-buffer section,
   wherein the control voltage section sets the control voltage through a current source and a voltage source.

9. The circuit of claim 8, wherein the pre-buffer section receives the control voltage through a pre-buffer buffer and then switchably transfers the control voltage to the output section.

10. The circuit of claim 8, wherein a current of the current source and a voltage of the voltage source establish an ON resistance of the control switch.

11. The circuit of claim 10, wherein the voltage of the voltage source is set by a junction of first and second resistors which divide voltage between a bandgap reference and ground.

12. The circuit of claim 11, wherein the first and second resistors are made of the same material.

13. The circuit of claim 12, wherein the first and second resistor values are determined by laser trimming.

14. The circuit of claim 12, wherein the first and second resistor values are determined by fuses.

15. The circuit of claim 8, wherein the current source is controlled by a digital-to-analog converter.

16. The circuit of claim 8, wherein a current of the current source is established by a bandgap reference and a third resistor.

17. The circuit of claim 8, wherein an output of the output section is a tristatable output.

18. The circuit of claim 8, wherein
   the pre-buffer section switchably transfers the control voltage through an active element.

19. The circuit of claim 18, wherein the active element includes a buffer.

20. The circuit of claim 18, wherein the active element includes a buffer and a switch.

21. A method for controlling ON resistance and skew of an output device, comprising the steps of:
   selecting a control switch having a control terminal and first and second terminals which matches an output switch of the output device, the output switch having a control terminal and first and second terminals;
   connecting one of the first and second terminals of the control switch and a corresponding one of the first and second terminals of the output switch to either the same power source or the same ground;
   setting an ON resistance across the first and second terminals of the control switch and setting a control terminal voltage at the control terminal of the control switch; and
   switchably transferring the control terminal voltage of the control switch to the control terminal of the corresponding output switch of the output device,
   wherein the control terminal voltage of the control switch is the voltage between the control terminal and either the power source or ground,
   wherein the ON resistance of the control switch matches an ON resistance of the corresponding output switch,
   wherein variations in ringing and skew are limited.

22. The method of claim 21, wherein the voltage from the voltage source is derived from the coupling of two resistors in a voltage divider.

23. The method of claim 21, wherein the step of setting an ON resistance across the first and second terminals of the control switch and setting a control terminal voltage at the control terminal of the control is accomplished through a current from a current source and a voltage from a voltage source.

24. A method of controlling the ON resistance of an output switch and the skew of the signal output by the output switch, comprising:
   setting an ON resistance of a first control switch of a control voltage generator, the first control switch having a control terminal and first and second terminals; and
   switchably setting the ON resistance of a first output switch of an output section to that of the ON resistance of the first control switch, the first output switch having a control terminal and first and second terminals, by matching the type of switch of the first control switch and the first output switch, by setting a corresponding one of the first and second terminals of each of the first output switch and the first control switch to the same voltage level, and by switchably setting the control terminals of both the first control switch and the first output switch to the same voltage level.

25. The method of claim 24, further comprising:

setting an ON resistance of a second control switch of a control voltage generator, the second control switch having a control terminal and first and second terminals; and switchably setting the ON resistance of a second output switch of an output section to that of the ON resistance of the second control switch, the second output switch having a control terminal and first and second terminals, by matching the type of switch of the second control switch and the second output switch, by setting a corresponding one of the first and second terminals of each of the second output switch and the second control switch to the same voltage level, and by switchably setting the control terminals of both the second control switch and the second output switch to the same voltage level, wherein the type of switch of the first control switch and the first output switch is not the same type of switch as the second control switch and the second output switch, wherein the voltage level the corresponding ones of the first and second terminals of the first control switch and the first output switch is not the same voltage level as the corresponding ones of the first and second terminals of the second control switch and the second output switch.

26. The method of claim 25, wherein the ON resistance of the first control switch is set by a current from a first current source and a voltage derived by a first voltage divider and the ON resistance of the second control switch is set by a current from a second current source and a voltage derived by a second voltage divider.

27. The method of claim 26, wherein the voltage derived by the first voltage divider is derived from a bandgap reference and the voltage derived by the second voltage divider is derived from the bandgap reference.

28. The method of claim 27, wherein an output signal from the output section is generated at an electrical connection between the first output switch and the second output switch.

29. The method of claim 28, wherein the output signal is 0.4 V to 2.4 V while driving a load of 50 ohms to VCC/2 in parallel with a capacitor load of 25 pF to ground up to 200 MHz rate.

* * * * *